US012628347B2

(12) United States Patent
Peng et al.

(10) Patent No.: US 12,628,347 B2
(45) Date of Patent: May 12, 2026

(54) MEMORY STRUCTURE WITH REDUCED READ DISTURB

(71) Applicant: MACRONIX International Co., Ltd., Hsinchu (TW)

(72) Inventors: Chi Sheng Peng, Hsinchu (TW); Ya Chun Tsai, Hsinchu City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 425 days.

(21) Appl. No.: 18/475,241

(22) Filed: Sep. 27, 2023

(65) Prior Publication Data

US 2025/0107097 A1      Mar. 27, 2025

(51) Int. Cl.
 H10B 43/35       (2023.01)
 H10B 41/27       (2023.01)
 H10B 41/35       (2023.01)
 H10B 43/27       (2023.01)

(52) U.S. Cl.
 CPC ............. H10B 43/35 (2023.02); H10B 41/27 (2023.02); H10B 41/35 (2023.02); H10B 43/27 (2023.02)

(58) Field of Classification Search
None
See application file for complete search history.

(56) References Cited

U.S. PATENT DOCUMENTS

| | | | |
|---|---|---|---|
| 2014/0347927 A1* | 11/2014 | Kim ................... | G11C 16/3427 |
| | | | 365/185.11 |
| 2021/0202520 A1* | 7/2021 | Jung ...................... | H10B 41/10 |
| 2023/0019540 A1 | 1/2023 | Song et al. | |
| 2023/0054445 A1 | 2/2023 | Kanamori et al. | |
| 2023/0170299 A1* | 6/2023 | Joe ......................... | H01L 23/528 |
| | | | 365/185.17 |

FOREIGN PATENT DOCUMENTS

| | | |
|---|---|---|
| TW | 202101254 | 1/2021 |
| TW | 202141698 | 11/2021 |
| TW | 202224153 | 6/2022 |

OTHER PUBLICATIONS

"Office Action of Taiwan Counterpart Application", issued on Sep. 4, 2024, pp. 1-6.

* cited by examiner

*Primary Examiner* — Nduka E Ojeh
(74) *Attorney, Agent, or Firm* — J.C. PATENTS

(57) ABSTRACT

A memory structure including a memory array is provided. The memory array is a block including six sub-blocks. The memory array includes string select line portions and ground select line portions. The string select line portions are arranged along a first direction. Each of the string select line portions is located in the corresponding sub-block. The ground select line portions are arranged along the first direction. Each of the ground select line portions is shared by only two corresponding sub-blocks. The memory structure may be a 3D NAND flash memory with high capacity and high performance.

15 Claims, 3 Drawing Sheets

MEMORY STRUCTURE WITH REDUCED READ DISTURB

BACKGROUND

Technical Field

The invention relates to a semiconductor structure, and particularly relates to a memory structure.

Description of Related Art

Since a non-volatile memory device (e.g., flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional (3D) NAND flash memory has been developed. However, there are still some challenges (e.g., read disturb) associated with the 3D NAND flash memory.

SUMMARY

The invention provides a memory structure, which can effectively reduce the read disturb.

The invention provides a memory structure, which includes a memory array. The memory array is a block including six sub-blocks. The memory array includes string select line portions and ground select line portions. The string select line portions are arranged along a first direction. Each of the string select line portions is located in the corresponding sub-block. The ground select line portions are arranged along the first direction. Each of the ground select line portions is shared by only two corresponding sub-blocks.

According to an embodiment of the invention, in the memory structure, each of the string select line portions may include at least one string select line.

According to an embodiment of the invention, in the memory structure, each of the ground select line portions may include at least one ground select line.

According to an embodiment of the invention, in the memory structure, the memory array may include a substrate and a stack structure. The stack structure is located on the substrate. The stack structure includes insulating layers and conductive layers alternately stacked.

According to an embodiment of the invention, in the memory structure, the ground select line positions may be located between the string select line portions and the substrate.

According to an embodiment of the invention, in the memory structure, each of the string select line portions may include at least one of the conductive layers in the upper portion of the stack structure. The conductive layers in the middle portion of the stack structure may be used as word lines. Each of the ground select line portions may include at least one of the conductive layers in the lower portion of the stack structure.

According to an embodiment of the invention, in the memory structure, the memory array may further include channel pillars. The channel pillars are located in the stack structure.

According to an embodiment of the invention, in the memory structure, the memory array may further include charge storage structures. The charge storage structures are located between the channel pillars and the word lines.

According to an embodiment of the invention, in the memory structure, the memory array may further include a first source line slit, a second source line slit, and a third source line slit. The first source line slit, the second source line slit, and the third source line slit may be sequentially arranged along the first direction and may extend along a second direction. The first direction may intersect the second direction.

According to an embodiment of the invention, in the memory structure, the six sub-blocks may include a first sub-block, a second sub-block, a third sub-block, a fourth sub-block, a fifth sub-block, and a sixth sub-block sequentially arranged along the first direction. The first sub-block, the second sub-block, and the third sub-block may be located between the first source line slit and the second source line slit. The fourth sub-block, the fifth sub-block, and the sixth sub-block may be located between the second source line slit and the third source line slit.

According to an embodiment of the invention, in the memory structure, the ground select line portions may include a first ground select line portion, a second ground select line portion, and a third ground select line portion sequentially arranged along the first direction. The first ground select line portion may be shared by the first sub-block and the second sub-block. The second ground select line portion may be shared by the third sub-block and the fourth sub-block. The third ground select line portion may be shared by the fifth sub-block and the sixth sub-block.

According to an embodiment of the invention, in the memory structure, the memory array may further include a first isolation slit and a second isolation slit. The first isolation slit and the second isolation slit may be sequentially arranged along the first direction and may extend along the second direction. The first isolation slit may be located between the first source line slit and the second source line slit. The second isolation slit may be located between the second source line slit and the third source line slit.

According to an embodiment of the invention, in the memory structure, the first ground select line portion may be located between the first source line slit and the first isolation slit. The second ground select line portion may be located between the first isolation slit and the second isolation slit. The third ground select line portion may be located between the second isolation slit and the third source line slit.

According to an embodiment of the invention, in the memory structure, the memory array may further include a third isolation slit, a fourth isolation slit, a fifth isolation slit, and a sixth isolation slit. The third isolation slit, the fourth isolation slit, the fifth isolation slit, and the sixth isolation slit may be sequentially arranged along the first direction and may extend along the second direction. The first sub-block may be located between the first source line slit and the third isolation slit. The second sub-block may be located between the third isolation slit and the fourth isolation slit. The third sub-block may be located between the fourth isolation slit and the second source line slit. The fourth sub-block may be located between the second source line slit and the fifth isolation slit. The fifth sub-block may be located between the fifth isolation slit and the sixth isolation slit. The sixth sub-block may be located between the sixth isolation slit and the third source line slit.

According to an embodiment of the invention, in the memory structure, the third isolation slit, the fourth isolation slit, the fifth isolation slit, and the sixth isolation slit may be located above the first isolation slit and the second isolation slit. The fourth isolation slit may be aligned with the first isolation slit. The fifth isolation slit may be aligned with the second isolation slit.

According to an embodiment of the invention, in the memory structure, the second source line slit may have an opening.

According to an embodiment of the invention, in the memory structure, the ground select line in the first ground select line portion may be integrally formed. The ground select line in the second ground select line portion may be integrally formed. The ground select line in the third ground select line portion may be integrally formed.

According to an embodiment of the invention, in the memory structure, the memory array may further include a seventh isolation slit. The seventh isolation slit may extend along the second direction. The seventh isolation slit may be located between the fourth isolation slit and the fifth isolation slit. The seventh isolation slit may be aligned with the second source line slit and the opening.

According to an embodiment of the invention, in the memory structure, the ground select line in the first ground select line portion may be integrally formed. The ground select line in the third ground select line portion may be integrally formed. The ground select line in the second ground select line portion may include a first conductive layer and a second conductive layer. The first conductive layer and the second conductive layer may be separated by the second source line slit. The first conductive layer and the second conductive layer may be electrically connected to each other.

According to an embodiment of the invention, in the memory structure, the first conductive layer may be located in the third sub-block. The second conductive layer may be located in the fourth sub-block.

Based on the above description, in the memory structure according to the invention, the memory array is the block including six sub-blocks, and each of the ground select line portions is shared by only two corresponding sub-blocks. Therefore, when performing the read operation on the memory structure, the read disturb can be reduced.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
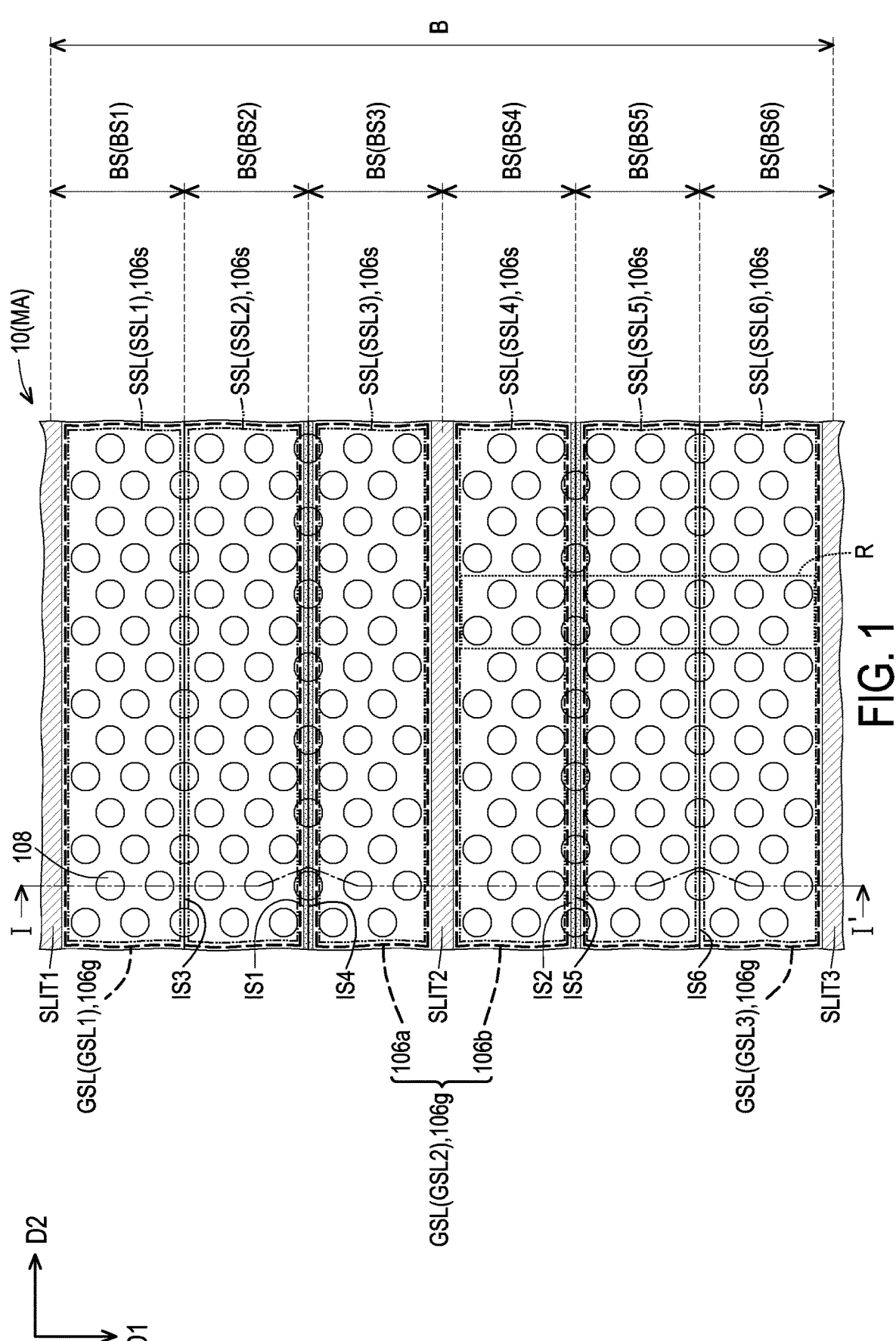
FIG. 1 is a top view of a memory structure according to some embodiments of the invention.
Figure 2:
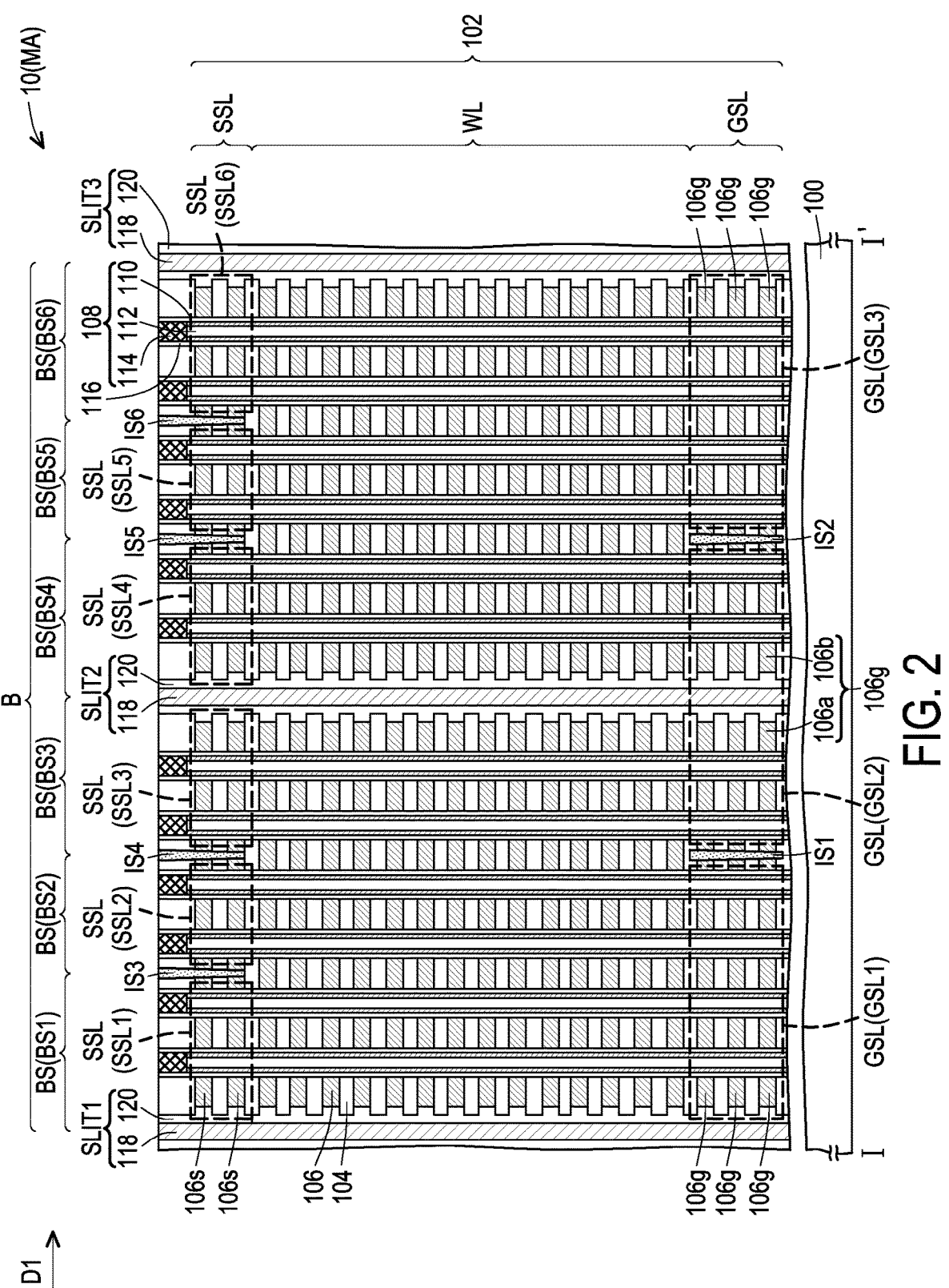
FIG. 2 is a cross-sectional view taken along section line I-I' in FIG. 1.

FIG. 1 is a top view of a memory structure according to some embodiments of the invention. FIG. 2 is a cross-sectional view taken along section line I-I' in FIG. 1. In addition, in the top view of FIG. 1, some components in the cross-sectional view of FIG. 2 are omitted to clearly illustrate the configuration relationship between the components in FIG. 1.

Referring to FIG. 1 and FIG. 2, a memory structure 10 includes a memory array MA. In some embodiments, the memory structure 10 may be a non-volatile memory structure such as a 3D NAND flash memory structure. The memory array MA is a block B including six sub-blocks BS. In some embodiments, the six sub-blocks BS may include a sub-block BS1, a sub-block BS2, a sub-block BS3, a sub-block BS4, a sub-block BS5, and a sub-block BS6 sequentially arranged along a direction D1. In addition, the number of the memory arrays MA is not limited to the number in the figure. As long as the number of the memory arrays MA is one or more, it falls within the scope of the invention.

The memory array MA includes string select line portions SSL and ground select line portions GSL. The string select line portions SSL are arranged along the direction D1. In some embodiments, the string select line portions SSL may extend along a direction D2. The direction D1 may intersect the direction D2. In some embodiments, the number of the string select line portions SSL may be six. In some embodiments, the string select line portions SSL may include a string select line portion SSL1, a string select line portion SSL2, a string select line portion SSL3, a string select line portion SSL4, a string select line portion SSL5, and a string select line portion SSL6 sequentially arranged along the direction D1.

Each of the string select line portions SSL is located in the corresponding sub-block BS. In some embodiments, the string select line portion SSL1 is located in the sub-block BS1. In some embodiments, the string select line portion SSL2 is located in the sub-block BS2. In some embodiments, the string select line portion SSL3 is located in the sub-block BS3. In some embodiments, the string select line portion SSL4 is located in the sub-block BS4. In some embodiments, the string select line portion SSL5 is located in the sub-block BS5. In some embodiments, the string select line portion SSL6 is located in the sub-block BS6.

The ground select line portions GSL are arranged along the direction D1. In some embodiments, the ground select line portions GSL may extend along the direction D2. In some embodiments, the number of the ground select line portions GSL may be three. In some embodiments, the ground select line portions GSL may include a ground select line portion GSL1, a ground select line portion GSL2, and a ground select line portion GSL3 sequentially arranged along the direction D1.

Each of the ground select line portions GSL is shared by only two corresponding sub-blocks BS. Therefore, when performing the read operation on the memory structure 10, the read disturb can be reduced. In some embodiments, the ground select line portion GSL1 may be shared by the sub-block BS1 and the sub-block BS2. In some embodiments, the ground select line portion GSL2 may be shared by the sub-block BS3 and the sub-block BS4. In some embodiments, the ground select line portion GSL3 may be shared by the sub-block BS5 and the sub-block BS6.

The memory array MA may include a substrate 100 and a stack structure 102. In some embodiments, the substrate 100 may be a semiconductor substrate such as a silicon substrate. In some embodiments, although not shown in the figure, the memory array MA may further include a device layer (including at least one active device and/or at least one passive device, etc.) and an interconnect structure layer (including at least one interconnect structure and at least one dielectric layer, etc.) located between the substrate 100 and the stack structure 102, and the description thereof is omitted here. In some embodiments, the ground select line portions GSL may be located between the string select line portions SSL and the substrate 100.

The stack structure 102 is located on the substrate 100. The stack structure 102 includes insulating layers 104 and conductive layers 106 alternately stacked. In some embodiments, the material of the insulating layer 104 may include silicon oxide. In some embodiments, the conductive layer 106 may include a barrier layer and a metal layer. In some embodiments, the material of the barrier layer may include titanium (Ti), titanium nitride (TiN), tantalum (Ta), tantalum nitride (TaN), or a combination thereof. In some embodiments, the material of the metal layer may include tungsten (W).

In some embodiments, each of the string select line portions SSL may include at least one of the conductive layers 106 in the upper portion of the stack structure 102. That is, the conductive layer 106 in the upper portion of the stack structure 102 may be used as a string select line 106s. Each of the string select line portions SSL may include at least one string select line 106s. For example, as shown in FIG. 2, each of the string select line portions SSL may include two string select lines 106s, but the invention is not limited thereto. In some embodiments, the string select line 106s in each of the string select line portions SSL may be integrally formed. In some embodiments, the string select lines 106s in each of the string select line portions SSL may be separately formed.

In some embodiments, the conductive layers 106 in the middle portion of the stack structure 102 may be used as word lines WL. In addition, the number of the word lines WL is not limited to the number shown in the figure.

Each of the ground select line portions GSL may include at least one of the conductive layers 106 in the lower portion of the stack structure 102. That is, the conductive layer 106 in the lower portion of the stack structure 102 may be used as a ground select line 106g. Each of the ground select line portions GSL may include at least one ground select line 106g. For example, as shown in FIG. 2, each of the ground select line portions GSL may include three ground select lines 106g, but the invention is not limited thereto. In some embodiments, the ground select line 106g in the ground select line portion GSL1 may be integrally formed. In some embodiments, the ground select lines 106g in the ground select line portion GSL1 may be separately formed. In some embodiments, the ground select line 106g in the ground select line portion GSL3 may be integrally formed. In some embodiments, the ground select lines 106g in the ground select line portion GSL3 may be separately formed. In addition, the conductive layers 106 may include a conductive layer 106a and a conductive layer 106b. The ground select line 106g in the ground select line portion GSL2 may include the conductive layer 106a and the conductive layer 106b. The conductive layer 106a and the conductive layer 106b may be separated from each other. For example, the conductive layer 106a and the conductive layer 106b may be separated by the source line slit SLIT2. The conductive layer 106a may be located in sub-block BS3. The conductive layer 106b may be located in the sub-block BS4. The conductive layer 106a and the conductive layer 106b may be electrically connected to each other. In some embodiments, the conductive layer 106a and the conductive layer 106b may be electrically connected to each other by an interconnect structure (not shown). In some embodiments, the ground select lines 106g in the ground select line portion GSL2 may be separately formed.

The memory array MA may further include channel pillars 108. The channel pillars 108 are located in the stack structure 102. In some embodiments, the channel pillar 108 may include a channel layer 110, an insulating pillar 112, and a conductive plug 114. In some embodiments, the channel pillars 108 are arranged by using 14 staggered channel pillars 108 as repeating units R, but the invention is not limited thereto. In some embodiments, the material of the channel layer 110 may include polysilicon. The insulating pillar 112 is located in the channel layer 110. In some embodiments, the material of the insulating pillar 112 may include silicon oxide. The conductive plug 114 is located on the channel layer 110 and the insulating pillar 112. The material of the conductive plug 114 may include doped polysilicon.

The memory array MA may further include charge storage structures 116. The charge storage structures 116 are located between the channel pillars 108 and the word lines WL. The charge storage structures 116 may be further located between the channel pillars 108 and the insulating layers 104. In some embodiments, the charge storage structure 116 may surround the channel pillar 108. In some embodiments, the charge storage structure 116 may be an oxide/nitride/oxide (ONO) composite layer.

The memory array MA may further include a source line slit SLIT1, a source line slit SLIT2, and a source line slit SLIT3. The source line slit SLIT1, the source line slit SLIT2, and the source line slit SLIT3 may be sequentially arranged along the direction D1 and may extend along the direction D2. Each of the source line slit SLIT1, the source line slit SLIT2, and the source line slit SLIT3 may include a source pillar 118 and a dielectric layer 120. In some embodiments, the material of the source pillar 118 may include doped polysilicon. The dielectric layer 120 is located between the source pillar 118 and the conductive layers 106, so that the source pillar 118 may be electrically insulated from the conductive layers 106. The dielectric layer 120 may be further located between the source pillar 118 and the insulating layers 104. In some embodiments, the material of the dielectric layer 120 may include silicon oxide.

In some embodiments, the sub-block BS1, the sub-block BS2, and the sub-block BS3 may be located between the source line slit SLIT1 and the source line slit SLIT2. In some embodiments, the sub-block BS4, the sub-block BS5, and the sub-block BS6 may be located between the source line slit SLIT2 and the source line slit SLIT3.

The memory array MA may further include an isolation slit IS1 and an isolation slit IS2. The isolation slit IS1 and the isolation slit IS2 may be located in the stack structure 102. The isolation slit IS1 and the isolation slit IS2 may be sequentially arranged along the direction D1 and may extend along the direction D2. The isolation slit IS1 may be located between the source line slit SLIT1 and the source line slit SLIT2. The isolation slit IS2 may be located between the source line slit SLIT2 and the source line slit SLIT3. In some embodiments, the materials of the isolation slit IS1 and the isolation slit IS2 may include insulating materials such as silicon oxide.

In some embodiments, the ground select line portion GSL1 and the ground select line portion GSL2 may be separated from each other by the isolation slit IS1. In some embodiments, the ground select line portion GSL2 and the ground select line portion GSL3 may be separated from each other by the isolation slit IS2. In some embodiments, the ground select line portion GSL1 may be located between the source line slit SLIT1 and the isolation slit IS1. The ground select line portion GSL2 may be located between the isolation slit IS1 and the isolation slit IS2. The ground select line portion GSL3 may be located between the isolation slit IS2 and the source line slit SLIT3.

The memory array MA may further include an isolation slit IS3, an isolation slit IS4, an isolation slit IS5, and an isolation slit IS6. The isolation slit IS3, the isolation slit IS4, the isolation slit IS5, and the isolation slit IS6 may be located in the stack structure 102. The isolation slit IS3, the isolation slit IS4, the isolation slit IS5, and the isolation slit IS6 may be sequentially arranged along the direction D1 and may extend along the direction D2. In some embodiments, the isolation slit IS3, the isolation slit IS4, the isolation slit IS5, and the isolation slit IS6 may be located above the isolation slit IS1 and the isolation slit IS2. In some embodiments, the isolation slit IS4 may be aligned with the isolation slit IS1. In some embodiments, the isolation slit IS5 may be aligned with the isolation slit IS2. In some embodiments, the materials of the isolation slit IS3, the isolation slit IS4, the isolation slit IS5, and the isolation slit IS6 may include insulating materials such as silicon oxide.

In some embodiments, the string select line portion SSL1 and the string select line portion SSL2 may be separated from each other by the isolation slit IS3. In some embodiments, the string select line portion SSL2 and the string select line portion SSL3 may be separated from each other by the isolation slit IS4. In some embodiments, the string select line portion SSL3 and the string select line portion SSL4 may be separated from each other by the source line slit SLIT2. In some embodiments, the string select line portion SSL4 and the string select line portion SSL5 may be separated from each other by the isolation slit IS5. In some embodiments, the string select line portion SSL5 and the string select line portion SSL6 may be separated from each other by the isolation slit IS6.

In some embodiments, the string select line portion SSL1 may be located between the source line slit SLIT1 and the isolation slit IS3. In some embodiments, the string select line portion SSL2 may be located between the isolation slit IS3 and the isolation slit IS4. In some embodiments, the string select line portion SSL3 may be located between the isolation slit IS4 and the source line slit SLIT2. The string select line portion SSL4 may be located between the source line slit SLIT2 and the isolation slit IS5. The string select line portion SSL5 may be located between the isolation slit IS5 and the isolation slit IS6. The string select line portion SSL6 may be located between the isolation slit IS6 and the source line slit SLIT3.

In some embodiments, the sub-block BS1 may be located between the source line slit SLIT1 and the isolation slit IS3. In some embodiments, the sub-block BS2 may be located between the isolation slit IS3 and the isolation slit IS4. In some embodiments, the sub-block BS3 may be located between the isolation slit IS4 and the source line slit SLIT2. The sub-block BS4 may be located between the source line slit SLIT2 and the isolation slit IS5. The sub-block BS5 may be located between the isolation slit IS5 and the isolation slit IS6. The sub-block BS6 may be located between the isolation slit IS6 and the source line slit SLIT3.

In some embodiments, the memory structure 10 may further include other required components (e.g., an interconnect structure (not shown) located on the stack structure 102), and the description thereof is omitted here.

Based on the above embodiments, in the memory structure 10, the memory array MA is the block B including six sub-blocks BS, and each of the ground select line portions GSL is shared by only two corresponding sub-blocks BS. Therefore, when performing the read operation on the memory structure 10, the read disturb can be reduced.

Figure 3:
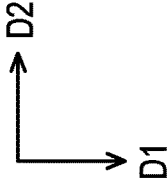
FIG. 3 is a top view of a memory structure according to other embodiments of the invention.

FIG. 3 is a top view of a memory structure according to other embodiments of the invention.

Referring to FIG. 1 and FIG. 3, the difference between a memory structure 20 of FIG. 3 and the memory structure 10 of FIG. 1 is as follows. In the memory structure 20, the source line slit SLIT2 may have an opening OP. In the memory structure 20, the ground select line 106g in the ground select line portion GSL2 may be integrally formed. In the memory structure 20, the memory array MA may further include an isolation slit IS7. The isolation slit IS7 may extend along the direction D2. The isolation slit IS7 may be located between the isolation slit IS4 and the isolation slit IS5. The isolation slit IS7 may be aligned with the source line slit SLIT2 and the opening OP. In the memory structure 20, the string select line portion SSL3 and the string select line portion SSL4 may be separated from each other by the isolation slit IS7 and the source line slit SLIT2. In some embodiments, the material of the isolation slit IS7 may include an insulating material such as silicon oxide.

In addition, in the memory structure 10 and the memory structure 20, the same or similar components are denoted by the same reference symbols, and the description thereof is omitted.

Based on the above embodiments, in the memory structure 20, the memory array MA is the block B including six sub-blocks BS, and each of the ground select line portions GSL is shared by only two corresponding sub-blocks BS. Therefore, when performing the read operation on the memory structure 20, the read disturb can be reduced.

In summary, in the memory structure of the aforementioned embodiments, since each of the ground select line portions is shared by only two corresponding sub-blocks, the read disturb can be reduced when performing the read operation on the memory structure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A memory structure, comprising:
a memory array, wherein the memory array is a block comprising six sub-blocks and comprises:

string select line portions arranged along a first direction, wherein each of the string select line portions is located in the corresponding sub-block;

ground select line portions arranged along the first direction, wherein each of the ground select line portions is shared by only two corresponding sub-blocks; and a first source line slit, a second source line slit, and a third source line slit sequentially arranged along the first direction and extending along a second direction, wherein the first direction intersects the second direction, the six sub-blocks comprise a first sub-block, a second sub-block, a third sub-block, a fourth sub-block, a fifth sub-block, and a sixth sub-block sequentially arranged along the first direction, the first sub-block, the second sub-block, and the third sub-block are located between the first source line slit and the second source line slit, the fourth sub-block, the fifth sub-block, and the sixth sub-block are located between the second source line slit and the third source line slit, and the second source line slit has an opening.

2. The memory structure according to claim 1, wherein each of the string select line portions comprises at least one string select line.

3. The memory structure according to claim 1, wherein each of the ground select line portions comprises at least one ground select line.

4. The memory structure according to claim 1, wherein the memory array comprises:

a substrate; and a stack structure located on the substrate and comprising insulating layers and conductive layers alternately stacked.

5. The memory structure according to claim 4, wherein the ground select line portions are located between the string select line portions and the substrate.

6. The memory structure according to claim 4, wherein each of the string select line portions comprises at least one of the conductive layers in a upper portion of the stack structure, the conductive layers in a middle portion of the stack structure are used as word lines, and each of the ground select line portions comprises at least one of the conductive layers in a lower portion of the stack structure.

7. The memory structure according to claim 6, wherein the memory array further comprises:

channel pillars located in the stack structure.

8. The memory structure according to claim 7, wherein the memory array further comprises:

charge storage structures located between the channel pillars and the word lines.

9. The memory structure according to claim 1, wherein the ground select line portions comprise a first ground select line portion, a second ground select line portion, and a third ground select line portion sequentially arranged along the first direction, the first ground select line portion is shared by the first sub-block and the second sub-block, the second ground select line portion is shared by the third sub-block and the fourth sub-block, and the third ground select line portion is shared by the fifth sub-block and the sixth sub-block.

10. The memory structure according to claim 9, wherein the memory array further comprises:

a first isolation slit and a second isolation slit sequentially arranged along the first direction and extending along the second direction, wherein the first isolation slit is located between the first source line slit and the second source line slit, and the second isolation slit is located between the second source line slit and the third source line slit.

11. The memory structure according to claim 10, wherein the first ground select line portion is located between the first source line slit and the first isolation slit, the second ground select line portion is located between the first isolation slit and the second isolation slit, and the third ground select line portion is located between the second isolation slit and the third source line slit.

12. The memory structure according to claim 10, wherein the memory array further comprises:

a third isolation slit, a fourth isolation slit, a fifth isolation slit, and a sixth isolation slit sequentially arranged along the first direction and extending along the second direction, wherein the first sub-block is located between the first source line slit and the third isolation slit, the second sub-block is located between the third isolation slit and the fourth isolation slit, the third sub-block is located between the fourth isolation slit and the second source line slit, the fourth sub-block is located between the second source line slit and the fifth isolation slit, the fifth sub-block is located between the fifth isolation slit and the sixth isolation slit, and the sixth sub-block is located between the sixth isolation slit and the third source line slit.

13. The memory structure according to claim 12, wherein the third isolation slit, the fourth isolation slit, the fifth isolation slit, and the sixth isolation slit are located above the first isolation slit and the second isolation slit, the fourth isolation slit is aligned with the first isolation slit, and the fifth isolation slit is aligned with the second isolation slit.

14. The memory structure according to claim 1, wherein a ground select line in the first ground select line portion is integrally formed, a ground select line in the second ground select line portion is integrally formed, and a ground select line in the third ground select line portion is integrally formed.

15. The memory structure according to claim 1, wherein the memory array further comprises:

a seventh isolation slit extending along the second direction, wherein the seventh isolation slit is located between the fourth isolation slit and the fifth isolation slit and is aligned with the second source line slit and the opening.

* * * * *